(12) United States Patent
Chiou

(10) Patent No.: US 6,171,903 B1
(45) Date of Patent: Jan. 9, 2001

(54) METHOD FOR FORMING A CYLINDER-SHAPED CAPACITOR USING A DIELECTRIC MASK

(75) Inventor: Jung-Chao Chiou, Hsin-Chu (TW)

(73) Assignee: United Microelectronics Corp., Hsin-Chu City (TW)

( * ) Notice: Under 35 U.S.C. 154(b), the term of this patent shall be extended for 0 days.

(21) Appl. No.: 09/322,502

(22) Filed: May 26, 1999

(51) Int. Cl.[7] .............. H01L 21/8242; H01L 21/20
(52) U.S. Cl. .............. 438/254; 438/253; 438/396; 438/397; 438/964
(58) Field of Search .................. 438/254, 396, 438/397, 253, 964

(56) References Cited

U.S. PATENT DOCUMENTS

| | | | | |
|---|---|---|---|---|
| 5,733,808 | * | 3/1998 | Tseng | 438/239 |
| 5,960,293 | * | 9/1999 | Hong et al. | 438/397 |
| 6,001,682 | * | 12/1999 | Chien | 438/239 |
| 6,025,246 | * | 2/2000 | Kim | 438/396 |
| 6,060,366 | * | 5/2000 | Hong | 438/397 |

OTHER PUBLICATIONS

H. Watanabe et al., "A New Cylindrical Capacitor Using Hemispherical Grained Si (HSG–Si) for 256Mb DRAMs", IEDM Tech Dig., pp. 259–262, Dec. 1992.*

* cited by examiner

Primary Examiner—John F. Niebling
Assistant Examiner—Jennifer M. Kennedy
(74) Attorney, Agent, or Firm—Harness, Dickey & Pierce, P.L.C.

(57) ABSTRACT

A method for forming a cylinder-shaped capacitor for dynamic random access memories (DRAMs) is disclosed. The method includes forming a silicon layer having a gap therein over a semiconductor substrate, followed by conformably forming a first dielectric layer on the silicon layer. Next, a second dielectric layer is formed on the first dielectric layer, filling the gap. After etching back the second dielectric layer, the first dielectric layer is removed until the silicon layer is exposed. Then the second dielectric layer is removed, and the silicon layer is etched using the first dielectric layer as a mask, thus forming a cylinder-shaped structure of the silicon layer over the substrate.

26 Claims, 2 Drawing Sheets

METHOD FOR FORMING A CYLINDER-SHAPED CAPACITOR USING A DIELECTRIC MASK

BACKGROUND OF THE INVENTION

1. Field of the Invention

The present invention relates to the capacitor of dynamic random access memories (DRAMs), and more particularly to a method for forming a cylinder-shaped capacitor of the DRAMs using a dielectric hard mask.

2. Description of the Prior Art

As the semiconductor memory device becomes highly integrated, the area occupied by a capacitor of a DRAM storage cell shrinks, thus decreasing the capacitance of the capacitor owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, which achieves both high cell integration and reliable operation.

One approach for increasing the capacitance while maintaining the high integration of the storage cells is directed toward the shape of the capacitor electrodes. In this approach, the cylinder-shaped capacitor has become to be widely used in DRAM devices. However, especially for giga bit DRAM using 0.18 micrometer technology and beyond, the manufacture of the cylinder-shaped capacitor of such a small size becomes very difficult, if not impossible.

For the foregoing reasons, there is a need for a method of forming a cylinder-shaped capacitor for the DRAMs, and for facilitating the manufacture of cylinder-shaped capacitors.

SUMMARY OF THE INVENTION

In accordance with the present invention, a method is provided for forming a cylinder-shaped capacitor for dynamic random access memories (DRAMs) that substantially increases its surface area and therefore its capacitance. Particularly, the present invention provides a method for forming a cylinder-shaped capacitor, facilitating the fabrication of giga bit DRAMs using 0.18 micrometer technology and beyond. In one embodiment, the present invention includes firstly forming an amorphous silicon layer having a gap therein over a semiconductor substrate and conformably forming a first dielectric layer on the amorphous silicon layer. Next, a second dielectric layer is formed on the first dielectric layer, filling the gap. After etching back the second dielectric layer until the first dielectric layer is exposed, the first dielectric layer is removed until the amorphous silicon layer is exposed. Then the second dielectric layer is removed, followed by etching the amorphous silicon layer using the first dielectric layer as a mask, thus forming a cylinder-shaped structure over the substrate. Finally, a hemispherical-grain (HSG) layer is formed on the surface of the cylinder-shaped structure, thus resulting in a cylinder-shaped bottom plate with hemi-spherical grain for the capacitor of the dynamic random access memory.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows the cross section of a provided amorphous silicon layer having a first dielectric layer and a second dielectric layer formed thereon;

FIG. 2 shows the cross section of the resultant structure after etching back the second dielectric layer;

FIG. 3 shows the cross section of the resultant structure after removing the first dielectric layer to expose the amorphous silicon layer;

FIG. 4 shows the cross section of the resultant structure after removing the second dielectric layer;

FIG. 5 shows the cross section of the resultant structure after etching the amorphous silicon layer using the residual first dielectric layer as a hard mask; and FIG. 6 shows the cross section of the resultant structure of the cylinder-shaped capacitor with hemi-spherical grain.

DESCRIPTION OF THE PREFERRED EMBODIMENT

Figure 1:
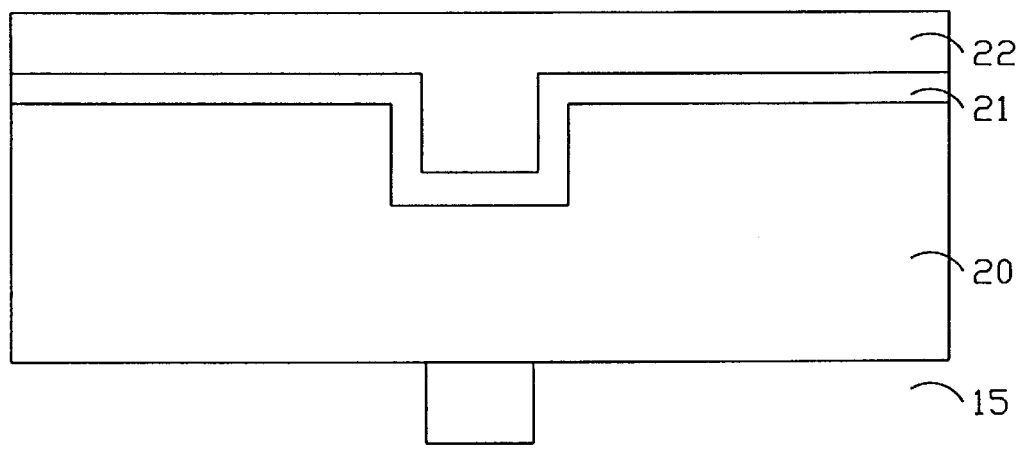
FIGS. 1 to 6 show cross-sectional views illustrative of various stages in the fabrication of a cylinder-shaped capacitor of DRAMs in accordance with one embodiment of the present invention. More specifically.

Referring to FIG. 1, a semiconductor substrate 15 useful in forming a semiconductor device is shown wherein a silicon layer 20 is formed thereon. In this embodiment, the silicon layer 20 is made from amorphous silicon using a well-known process, and serves as the material for the bottom plate of the capacitor of dynamic random access memories (DRAMs). The choice of the thickness of the amorphous silicon layer 20 depends on the requisite height of the fabricated capacitor. In this embodiment, the amorphous silicon layer 20 is approximately has 8000 angstroms in thickness. It is noted that the amorphous silicon layer 20 has a gap formed therein as shown. In this embodiment, this gap has a height of about 2000 angstroms and has a width of about 2300 angstroms. As will be better understood in the following steps, the gap in the amorphous silicon layer 20 is primarily used to function as a hard mask, which is subsequently utilized to form the required cylinder-shaped capacitor of the present invention. Therefore, it is appreciated by those skilled in the art that the dimension of the gap is scalable according to the predetermined dimension of the fabricated capacitor of the DRAMs.

Next, a first dielectric layer 21 is conformably deposited on the surface of the amorphous silicon layer 20, and the bottom and sidewall surface of the associated gap. The thickness of the first dielectric layer 21 can be in the range of about 0 to 5000 angstroms, preferably 500 angstroms. The first dielectric layer 21 can be made from any typical well-known dielectric material used in wafer fabrication, but is preferably silicon nitride. A conventional chemical vapor deposition (CVD) process is performed to achieve the conformity of this dielectric layer 21. Subsequently, a second dielectric layer 22 is further deposited on the surface of the first dielectric layer 21, filling the gap in the amorphous silicon layer 20 and covering the deposited first dielectric layer 21. Similar to the formation of the first dielectric layer 21, the second dielectric layer 22 can be made from any typical dielectric material used in wafer fabrication, and the thickness of the second dielectric layer 22 is preferably 2000 angstroms. Nevertheless, the material for the second dielectric layer 22 is chosen so that the etch selectivity of the first dielectric layer 21 is somewhat different from that of the second dielectric layer 22. In this embodiment, the second dielectric layer is made from silicon oxide using a conventional CVD process. Alternatively, the first dielectric layer 21 can be made of silicon oxide, and the second dielectric layer 22 of silicon nitride without modifying the following steps of the present invention.

Figure 2:
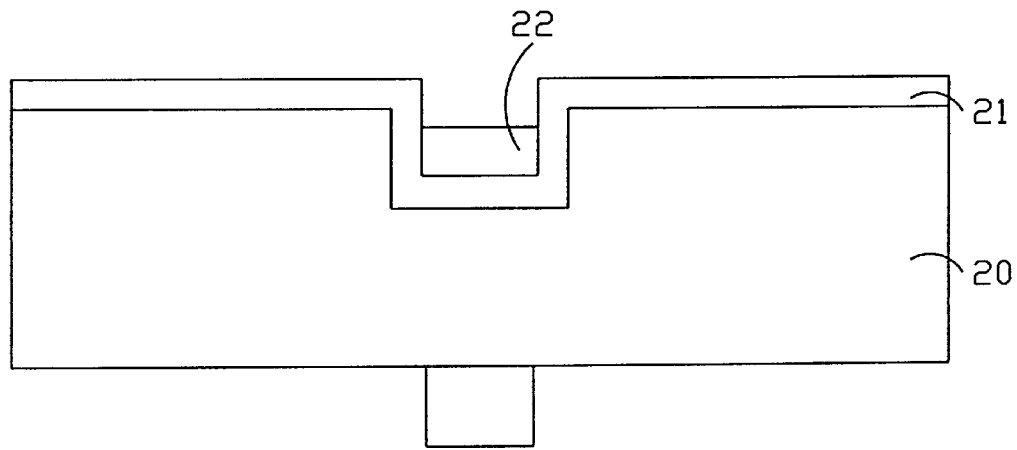

The second dielectric layer 22 is then subjected to an etching back process, which stops at the surface of the first dielectric layer 21, thus exposing the surface of the first dielectric layer 21 as shown in FIG. 2. The etch technique used in this embodiment can be a conventional oxide etch-back process. Subject to the etching recipe or etching duration, the surface of the etched second dielectric layer 22 can be lower than that of the first dielectric layer (as shown in the figure) or can be approximately the same, wherein either situation results in the same structure of the final fabricated capacitor.

Figure 3:
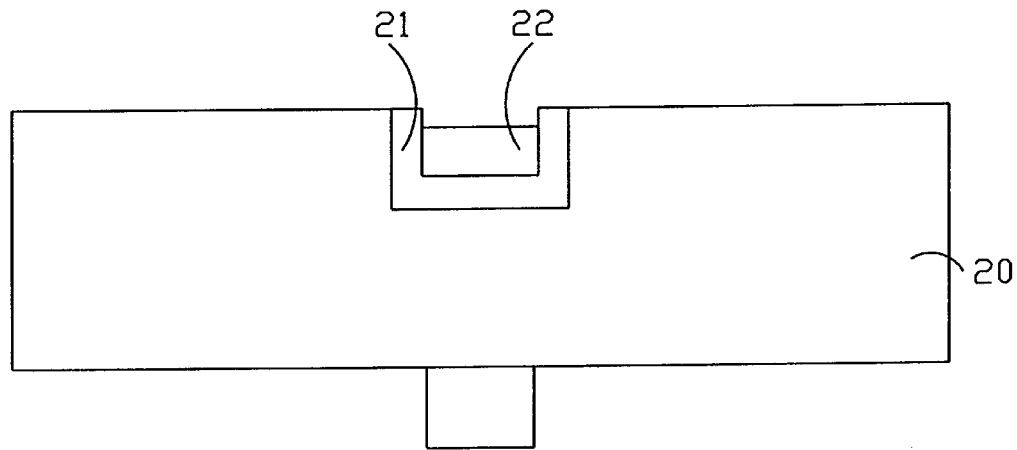

The deposited first dielectric layer 21 over the amorphous silicon layer 20 is then removed until the surface of the amorphous silicon layer 20 is exposed, resulting in the structure shown in FIG. 3. In this embodiment, a conventional dielectric etch method is applied in achieving the required structure. It is noted that the first dielectric layer 21 in the gap is not affected by the applied etching due to the protection from the residual second dielectric layer 22 in the gap.

Figure 4:
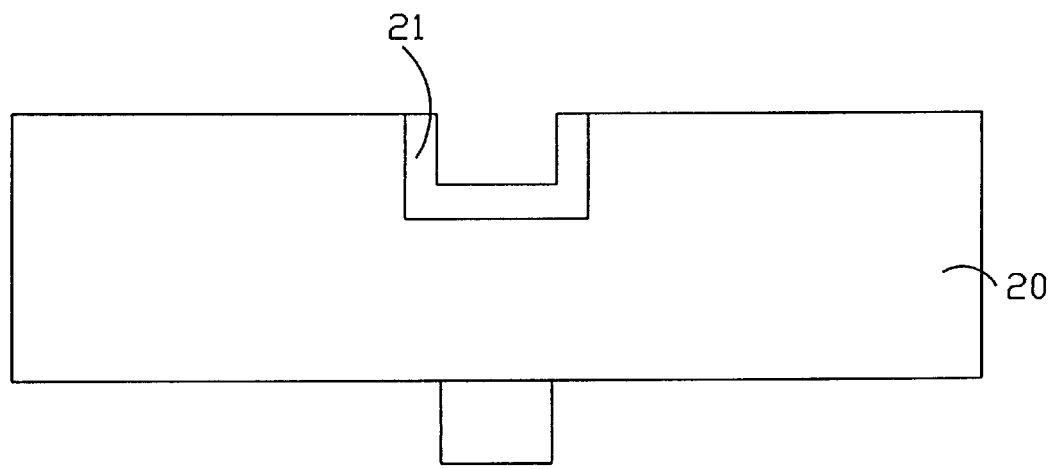

The residual second dielectric layer 22 in the gap is then removed, for example, by dipping the structure of the FIG. 3 in a solution DHF, resulting in the structure with the cross section shown in FIG. 4.

Figure 5:
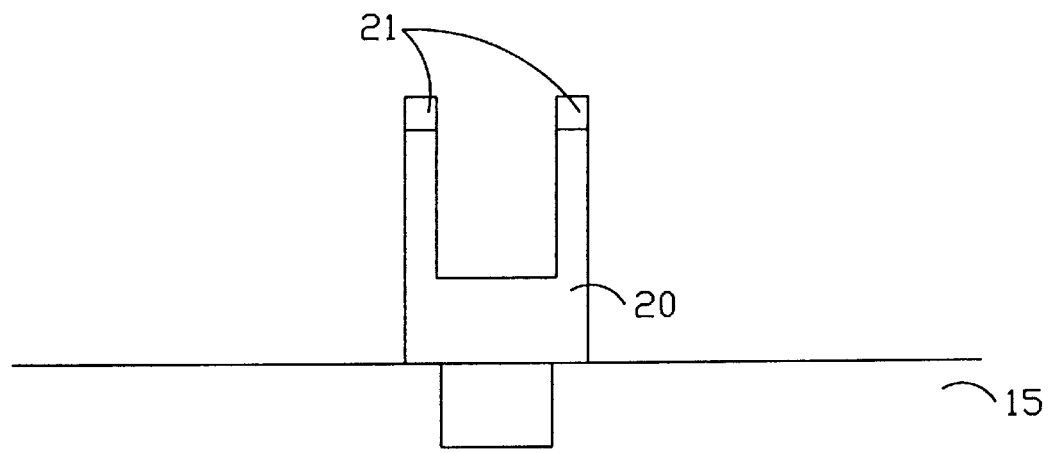

The amorphous silicon layer 20 is then subjected to a conventional is etching process, until the surface of the substrate 15 is exposed, by using the first dielectric layer 21 in the gap as a hard mask. The resultant structure has a cylindrical shape, and is shown in FIG. 5. It is noted that the bottom part of the first dielectric layer 21 is finally etched away, while a portion of the sidewall first dielectric layer 21 still endures the whole etch process due to its substantial thickness (2000 angstroms in this embodiment).

Figure 6:
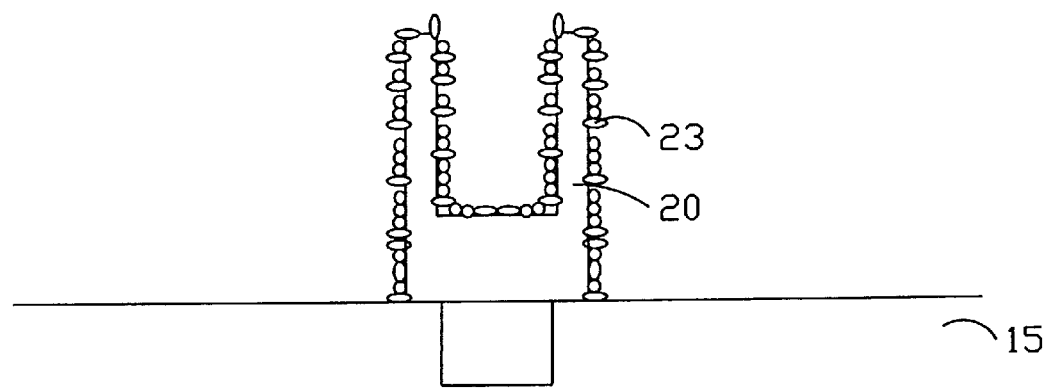

After removing the residual first dielectric layer 21 by a standard process, the inner surface and the outer surface of the formed cylinder-shaped structure, including its inner bottom surface, are covered by a hemi-spherical-grain (HSG) layer 23 as shown in FIG. 6. The formation of the HSG layer 23 is a standard process in the semiconductor industry, and is often referred to as selective HSG because of its selective formation on the surface of the amorphous silicon layer 20 rather than on the semiconductor substrate 15.

Accordingly, the bottom plate (or electrode) of the cylinder-shaped capacitor of the DRAMs is thus obtained. To complete the fabrication of the DRAM capacitor, a capacitor dielectric layer (not shown), such as tantalum oxide or oxide/nitride/oxide, is then formed on the bottom plate. Then a doped polysilicon layer deposited on the capacitor dielectric layer, to form the upper plate (or electrode).

Although specific embodiments have been illustrated and described, it will be obvious to those skilled in the art that various modifications may be made without departing from what is intended to be limited solely by the appended claims.

What is claimed is:

1. A method for forming a cylinder-shaped capacitor of a dynamic random access memory, said method comprising:
    forming a silicon layer over a semiconductor substrate, said silicon layer having a gap formed therein;
    conformably forming a first dielectric layer on said silicon layer;
    forming a second dielectric layer on said first dielectric layer, filling said gap;
    etching back said second dielectric layer until said first dielectric layer is exposed, wherein the surface of said first dielectric layer is flat;
    removing a portion of said first dielectric layer until said silicon layer is exposed;
    removing said second dielectric layer; and
    etching said silicon layer using said first dielectric layer as a mask, thus forming a cylinder-shaped structure of said silicon layer over the substrate.

2. The method according to claim 1, wherein said first dielectric layer comprises silicon nitride.

3. The method according to claim 2, wherein said second dielectric layer comprises silicon oxide.

4. The method according to claim 1, wherein said first dielectric layer comprises silicon oxide.

5. The method according to claim 4, wherein said second dielectric layer comprises silicon nitride.

6. The method according to claim 1, wherein said silicon layer is an amorphous silicon layer, and said gap in the amorphous silicon layer has a depth of about 2000 angstroms.

7. The method according to claim 6, wherein thickness of said first dielectric layer is about 0–5000 angstroms.

8. The method according to claim 7, wherein thickness of said second dielectric layer is about 2000 angstroms.

9. The method according to claim 8, wherein said second dielectric layer is etched back by a dielectric dry etching technique.

10. The method according to claim 9, wherein said first dielectric layer is removed by a dry etching technique.

11. The method according to claim 10, wherein said second dielectric layer is removed by dipping in a wet bench solution.

12. The method according to claim 11, wherein said silicon layer is etched by a Si dry etching technique.

13. A method for forming a cylinder-shaped capacitor with hemispherical grain of a dynamic random access memory, said method comprising:
    forming an amorphous silicon layer over a semiconductor substrate, said amorphous silicon layer having a gap formed therein;
    conformably forming a first dielectric layer on said silicon layer;
    forming a second dielectric layer on said first dielectric layer, filling said gap;
    etching back said second dielectric layer until said first dielectric layer is exposed, wherein the surface of said first dielectric layer is flat;
    removing a portion of said first dielectric layer until said amorphous silicon layer is exposed;
    removing said second dielectric layer;
    etching said amorphous silicon layer using said first dielectric layer as a mask, thus forming a cylinder-shaped structure of said amorphous silicon layer over the substrate; and
    forming a hemi-spherical-grain (HSG) layer on a surface of said cylinder-shaped structure, thus resulting in a cylinder-shaped bottom plate with hemispherical grain for the capacitor of the dynamic random access memory.

14. The method according to claim 13, wherein said first dielectric layer comprises silicon nitride.

15. The method according to claim 14, wherein said second dielectric layer comprises silicon oxide.

16. The method according to claim 13, wherein said first dielectric layer comprises silicon oxide.

17. The method according to claim 16, wherein said second dielectric layer comprises silicon nitride.

18. The method according to claim 13, wherein said first dielectric layer is removed by an etching back technique.

19. The method according to claim 18, wherein said second dielectric layer is removed by dipping in a wet bench solution.

20. The method according to claim 19, wherein said amorphous silicon layer is etched by a Si dry technique.

21. A method for forming a cylinder-shaped capacitor of a dynamic random access memory, said method comprising:

forming an amorphous silicon layer over a semiconductor substrate, said amorphous silicon layer having a trench formed therein;

conformably forming a first dielectric layer on said amorphous silicon layer;

forming a second dielectric layer on said first dielectric layer, filling said trench, wherein said second dielectric layer comprises material different from that of said dielectric layer;

etching back said second dielectric layer so that a portion of said first dielectric layer is etched until said amorphous silicon layer is exposed, wherein the surface of said first dielectric layer is flat, said remained second dielectric layer in the trench being used to protect the first dielectric layer on a bottom surface in the trench from being etched, wherein unetched portion of the first dielectric layer is located on sidewalls and the bottom surface of the trench;

removing said remained second dielectric layer using said unetched first dielectric layer on the sidewalls of the trench as a mask, thus forming a cylinder-shaped structure of said amorphous silicon layer over the substrate.

22. The method according to claim 21, further comprising a step of forming a hemi-spherical-grain (HSG) layer on a surface of said cylinder-shaped structure, thus resulting in a cylinder-shaped bottom plate with hemispherical grain for the capacitor of the dynamic random access memory.

23. The method according to claim 21, wherein said first dielectric layer comprises silicon nitride.

24. The method according to claim 21, wherein said second dielectric layer comprises silicon oxide.

25. The method according to claim 21, wherein said first dielectric layer comprises silicon oxide.

26. The method according to claim 21, wherein said second dielectric layer comprises silicon nitride.

* * * * *